United States Patent [19]
Ip

[11] Patent Number: 6,040,625
[45] Date of Patent: Mar. 21, 2000

[54] SENSOR PACKAGE ARRANGEMENT

[75] Inventor: Matthew W. Ip, Austin, Tex.

[73] Assignee: I/O Sensors, Inc., Austin, Tex.

[21] Appl. No.: 08/935,093

[22] Filed: Sep. 25, 1997

[51] Int. Cl.[7] .................................................. H01L 23/34
[52] U.S. Cl. ........................ 257/719; 257/688; 257/727; 257/785
[58] Field of Search ................................... 257/785, 719, 257/727, 688, 689; 73/514.32

[56] References Cited

U.S. PATENT DOCUMENTS

| | | |
|---|---|---|
| 3,559,004 | 1/1971 | Rambeau et al. ........................ 257/785 |
| 4,030,001 | 6/1977 | Medley, Jr. et al. . |
| 4,825,282 | 4/1989 | Fukaya . |
| 4,879,589 | 11/1989 | Saint-cyr ................................. 257/785 |
| 5,057,904 | 10/1991 | Nagato et al. . |
| 5,233,873 | 8/1993 | Mozgowiec et al. . |
| 5,258,647 | 11/1993 | Wojnarowski et al. . |
| 5,345,823 | 9/1994 | Reidemeister et al. . |
| 5,394,009 | 2/1995 | Loo . |
| 5,414,298 | 5/1995 | Grube . |
| 5,434,357 | 7/1995 | Belcher et al. . |
| 5,446,316 | 8/1995 | Temple et al. . |
| 5,468,910 | 11/1995 | Knapp et al. . |
| 5,471,011 | 11/1995 | Maslakow . |
| 5,503,016 | 4/1996 | Koen . |
| 5,551,294 | 9/1996 | Hermann . |
| 5,623,167 | 4/1997 | Tabuchi ................................... 257/794 |
| 5,789,804 | 8/1998 | Matsuoka et al. ........................ 257/669 |

*Primary Examiner*—Donald L. Monin, Jr.
*Assistant Examiner*—Michael Dietrich
*Attorney, Agent, or Firm*—Gary L. Bush; Mayor, Day, Caldwell & Keeton LLP.

[57] ABSTRACT

A highly sensitive silicon micro-machined sensor package is provided for use in a micro-g environment that can also resist high shock in excess of 5000 g. The sensor is provided to measure acceleration in cooperation with associated electronics which are required to have electrical contact with sensor elements. The sensor is sealed in a high vacuum environment, and is arranged and designed to be free of temperature induced stress to the sensor. The sensor die package assembly comprises a silicon micro-machined sensor die, a ceramic package, two contact springs, a shorting clip, solder preform, a metal lid and a getter foil for ensuring a good vacuum for an extended period. The sensor die comprises a moving mass with eight supporting flexures on both sides of the proof mass. The proof mass's movement is protected on both sides by a top and a bottom cap. Acceleration applied to the package and the die causes the proof mass to move vertically in relation with the adjacent caps. The changes in distance between the proof mass and the caps in turn generate a change in an electrical signal which corresponds to the capacitance changes between the gaps. The sensor die package arrangement provides that the sensor die be secured within an evacuated ceramic case. Electrical connections made between external contacts of the case and contacts of the sensor die within the case are made through conductive springs, thereby minimizing materials in the interior of the case which would outgass in the vacuum environment.

8 Claims, 6 Drawing Sheets

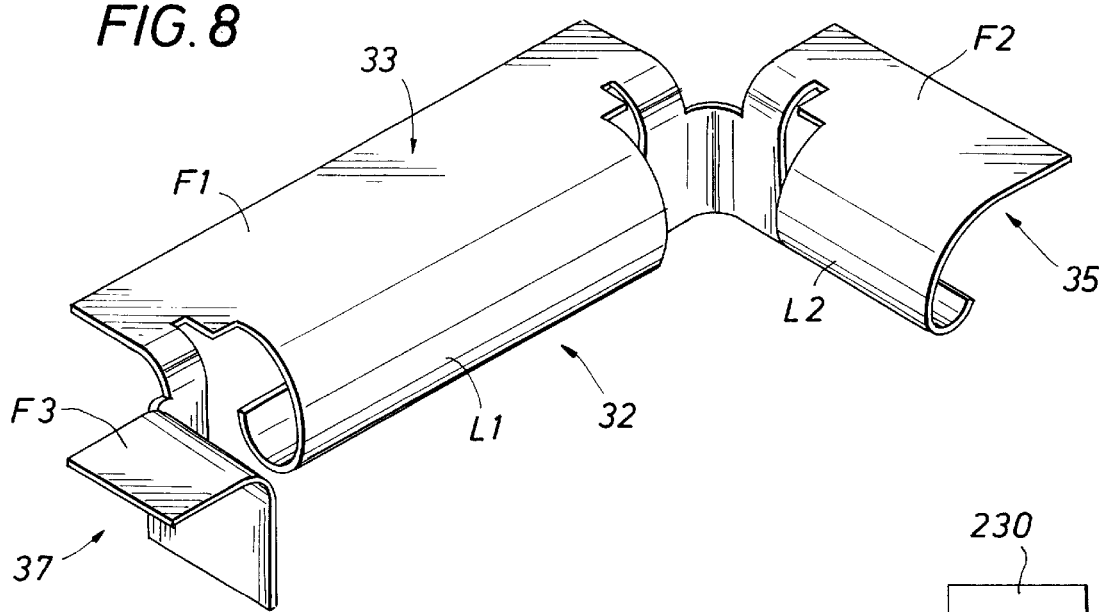
FIG. 8
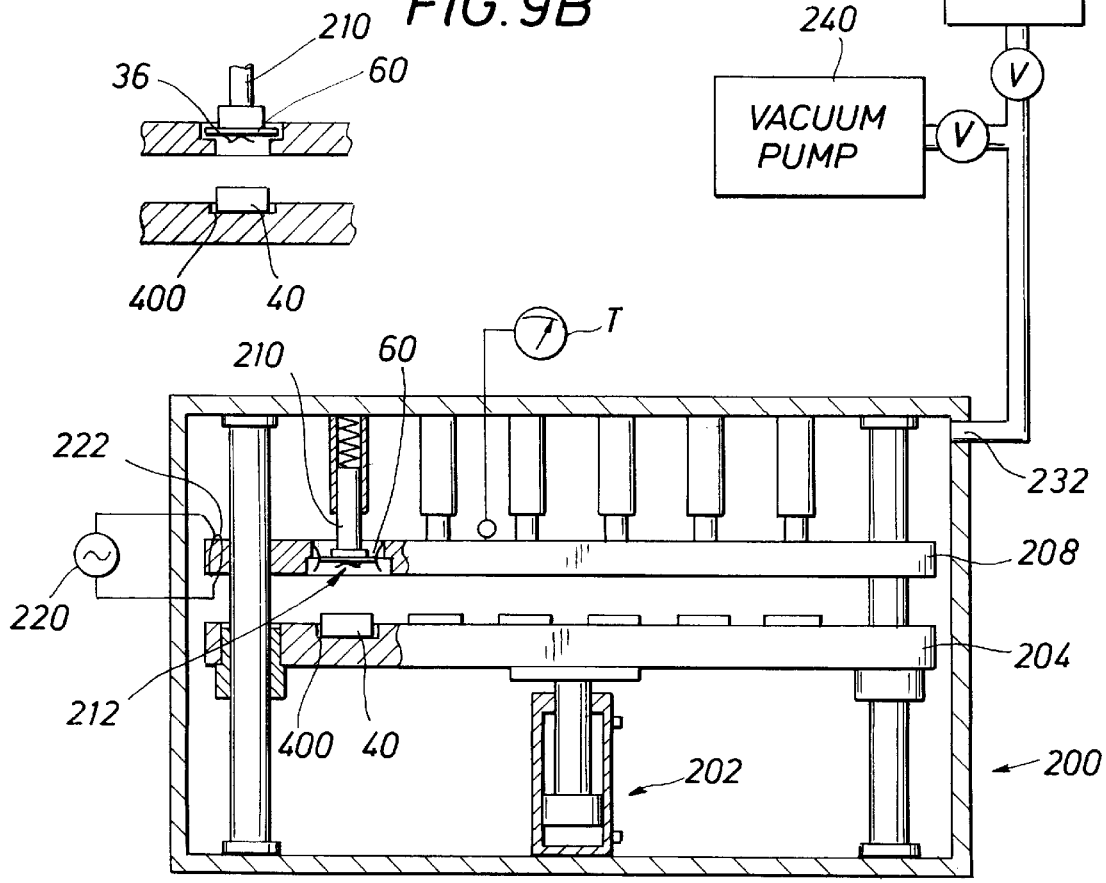
FIG. 9B
FIG. 9A

SENSOR PACKAGE ARRANGEMENT

BACKGROUND OF THE INVENTION

1. Field of the Invention

This invention relates generally to packaging arrangement for a sensor. In particular the invention relates to a packaging arrangement including a case for a micro-machined-semiconductor sensor die which establishes electrical contact between electrical leads of the sensor die and external contacts of the case, and for immobilizing the die within the case. Still more particularly the invention relates to a packaging arrangement in which a sensor die is electrically connected to outside contacts and secured within an evacuated cavity of a case without organic materials of any kind inside the cavity.

2. Description of the Prior Art

The sensor die to be packaged is a micro-machined device manufactured from silicon and arranged and designed to measure acceleration along a principal axis. The sensor includes a moving proof silicon mass supported from a surrounding frame of silicon by eight supporting springs on top and bottom sides of the proof mass. The proof mass moves between top and bottom caps which face top and bottom surfaces of the proof mass, but are spaced therefrom. The top and bottom caps are secured to the surrounding support frame from which the proof mass is supported. The sensor die is described in U.S. Pat. No. 5,652,384 and in pending U.S. application Ser. No. 08/516,501, both of which are incorporated by reference.

Acceleration of the support frame causes the proof mass to move vertically with respect to the top and bottom caps and the support frame. The variation in distance between the proof mass and the top and bottom caps changes the capacitance between the proof mass and the caps, and an electrical signal corresponding to such capacitance is measured by the sensor. In a "nutshell", the distance between the top and bottom caps, and the surrounding silicon support frame must be precisely controlled and remain stable in order to obtain the extremely high sensitivity requirements of the sensor.

Thus, for extreme sensitivity requirements, the silicon frame and the silicon top and bottom caps to which electrical conductivity paths must run to outside contacts of the package, must remain dimensionally stable, so as not to induce error signals due to extraneous changes in the dimension of the frame and the top and bottom caps with respect to the proof mass.

The sensor die to be packaged is designed to be sensitive to extremely small forces, e.g., one millionth ($10^{-6}$) of a gravitational unit "g". As a reference comparison, a typical automobile airbag micro-machined accelerometer requires only one tenth ($10^{-1}$) of a gravitational unit "g" sensitivity. While the sensor must be capable to measure extremely small accelerations, it also must be able to withstand extremely high shocks in excess of 5000 g.

The sensor to be packaged is to be used for seismic measurements in the exploration for hydrocarbon deposits, and for downhole positioning devices for oil and gas well drilling and for inertial guidance systems. Each of such applications calls for extreme sensitivity in order to expand the boundaries of the measurements of those specialities. Furthermore, the physical environment in which the sensor must work is extreme. The sensor must survive high shocks and wide temperature ranges of from −40° C. to +85° C.

Because of the high sensitivity requirement, the sensor must be packaged in a high vacuum (e.g., $10^{-3}$ mm of Hg for 10 years) in order to reduce an effect called Squeeze Film Damping and in order to increase the quality of the signal. Squeeze Film Damping is a damping phenomenon caused if air is trapped between two closely separated surfaces. The distance between top or bottom surfaces of the proof mass and the top and bottom caps of the die to be packaged for capacitive measurements is about one to two micrometers ($10^{-6}$ meter) in distance.

Prior packaging arrangements have required some sort of die attach material to affix the sensor die to a case or enclosure. For example, solder has been used in prior art packaging methods to secure the die to a surrounding enclosure. However, the difference in the thermal expansion of different materials (silicon support frame, solder attach material and ceramic packages) can induce strain to the silicon electrode surface thereby distorting the accuracy of the acceleration output signal especially where specifications of −40° C. to +85° C. operating temperatures are required.

Vacuum packaging requirements also creates problems not solved by the prior art. Prior art packaging methods typically use epoxy, RTV or organic adhesives to fix a sensor die to a case. But the use of such adhesive materials, where a high vacuum must exist for the die inside the enclosure, causes outgassing of such material inside the evacuated enclosure. Outgassing causes molecules to be added to the space inside the enclosure thereby decreasing the vacuum level inside the package.

Prior packaging arrangements have also typically required bonding materials for electrical connections or bond wires between contacts of the sensor die and external contacts of the package. However, in order for bond wire to install and function properly, the sensor die has to be affixed to the package with solder or other adhesive material that can either cause outgassing or induce stress to the die.

3. Identification of Objects of the Invention

A primary object of the invention is to provide a packaging arrangement which secures a micro-machined silicon sensor die to an enclosure without the use of attach materials between the die and the enclosure.

Another object of the invention is to provide a securing arrangement for a sensor die within an enclosure while providing high vacuum of the die inside the enclosure and minimizing the chance for outgassing of materials inside the enclosure.

Another object of the invention is to secure a sensor die within a ceramic package enclosure while providing connections to the sensor from electrical contacts on the exterior of the ceramic package without the use of organic materials.

Another object of the invention is to provide a secure coupling between a sensor die and an enclosure which prevents relative movement when the enclosure is subjected to high shock loads.

Another object of the invention is to provide a high vacuum level of the die while enclosed in its case and to maintain such vacuum level throughout a long operating life of the sensor.

Another object of the invention is to provide a packaging arrangement for an extremely sensitive acceleration sensor which is isolated from strain due to differences in thermal expansion between the silicon of the sensor and all the materials which connect the sensor to external electrical contacts of the package.

Another object of the invention is to provide an accelerometer/enclosure arrangement which is rugged, simple to install, and reliable under conditions of wide variations of operating temperatures, high vacuum inside the enclosure and high external shock.

SUMMARY OF THE INVENTION

The invention is embodied in a packaging arrangement for a sensor die which is manufactured by micro-machined techniques of highly doped silicon. The sensor is of virtually all silicon material and uses capacitive pickoff and electrostatic rebalance for high precision and stability. The sensor die is secured within a ceramic enclosure by means of spring contacts and after vacuum evacuation, a lid with a downwardly facing spring seals the die within the enclosure. Electrical communication paths are provided between contacts of the die and electrical contact pads on an external surface of the enclosure.

BRIEF DESCRIPTION OF THE DRAWINGS

The objects, advantages and features of the invention will become more apparent by reference to the drawings which are appended hereto and wherein an illustrative embodiment of the invention is shown, of which:

FIG. 8 is a perspective view of a center spring device for forcing the die in two directions toward a corner of the enclosure; and FIG. 9A is an illustration showing equipment for the process of vacuum evacuation of one of a plurality of die/case assemblies, with FIG. 9B being an enlarged view of the case and lid assembly prior to final closure.

DESCRIPTION OF THE PREFERRED EMBODIMENT OF THE INVENTION

Figure 1:
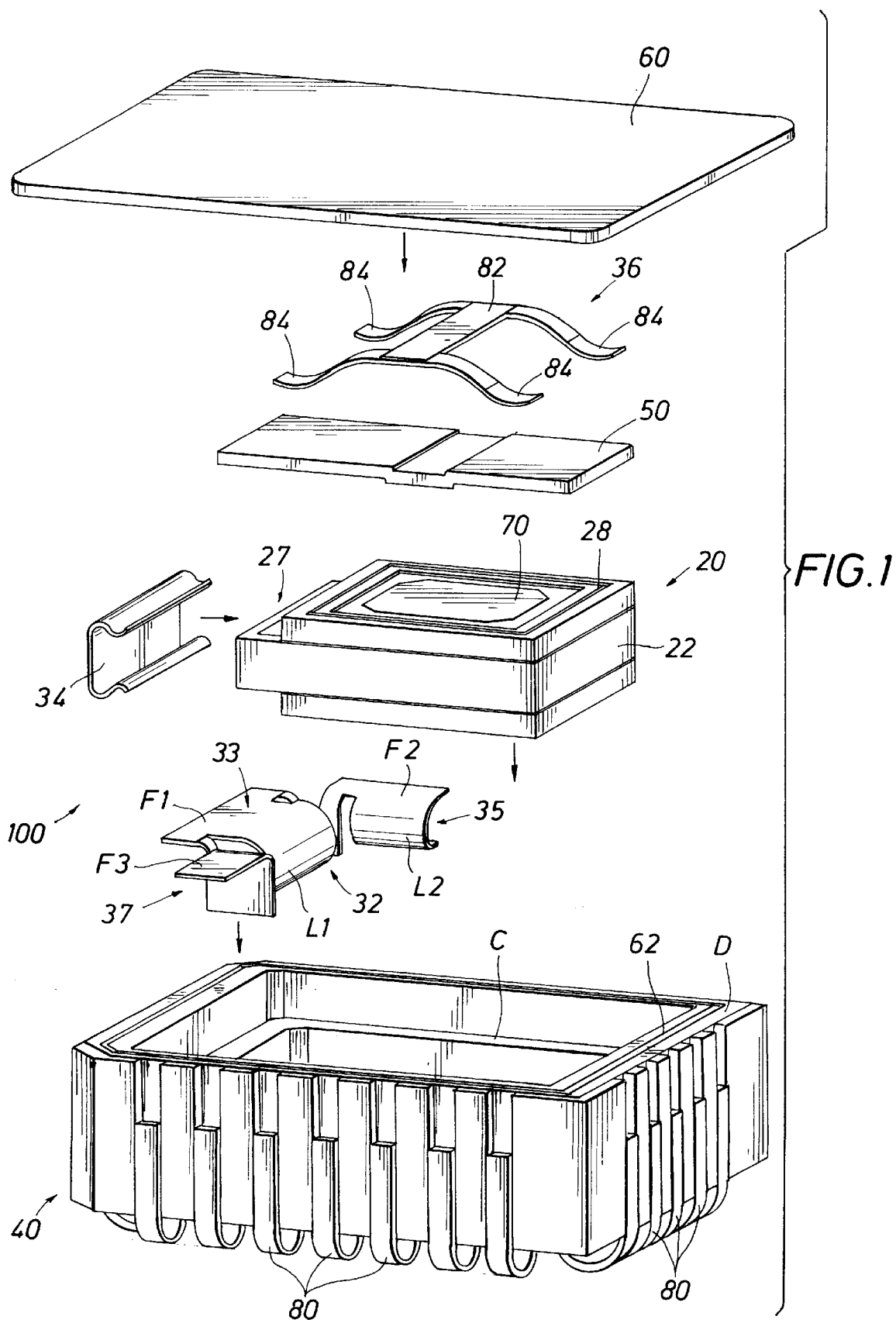
FIG. 1 is an exploded view of a sensor die and a ceramic case in which it is packaged along with a lid, spring and other components for securing the sensor die within the enclosure while providing electrical connections to external contacts of the enclosure.

FIG. 1 shows an exploded view of the sensor/packaging arrangement 100 of the invention. A ceramic case 40 is provided to enclose the sensor die 20. A center contact spring 32 is inserted first into the ceramic case 40. (Also see FIG. 8 for an enlarged view of spring 32). A shorting clip 34 is installed on a projecting end 27 of center section 22 of the sensor 20. The sensor 20 with shorting clip 34 is placed into the ceramic case. A getter 50 and top contact spring 36 are secured to the bottom side of lid 60 and after vacuum evacuation, the lid 60 is secured on top of the ceramic case 40 while pressing downwardly on top contact spring 36 and the sensor die 20. Details of the elements of the assembly and their cooperative arrangement with each other follows.

Description of Ceramic Case 40

FIGS. 1, 2, 4, 5A, 5B, 5C and 6 illustrate ceramic case 40 in which sensor die 20 is placed. Ceramic case 40 is a multilayer co-fire alumina leadless chip carrier. The interior or cavity of case 40 has three levels. The bottom level B is plated with gold, but has a "gap" portion G which is not plated and remains an insulator. A surface at the bottom of the cavity labeled B' is also gold plated. The gap portion G separates area B from B' at the bottom B of the cavity.

A peripheral step area or ledge C is also plated with gold except for a small step down area S at the east end of the cavity, as best seen in FIGS. 2 and 5A, 5B, 5C. Step down area S on ledge C allows a center contact spring 32 to be secured to the remaining portion C' of ledge C at the east end of the cavity. Remaining portion C' is plated with gold as is the remainder of peripheral ledge C. The top ring D is also gold plated and has a solder preform 62 applied to the top of the plated gold as best seen in FIGS. 5A, 5B, 5C, and 6.

Figure 7:
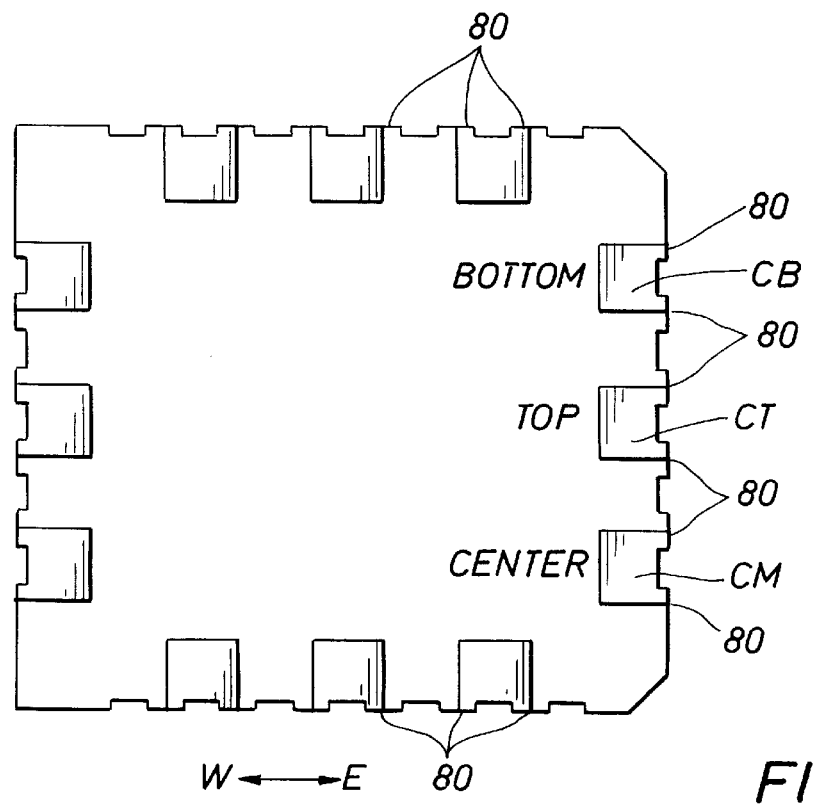
FIG. 7 is an external view of the bottom of the enclosure showing external contact pads.
Figure 5A:
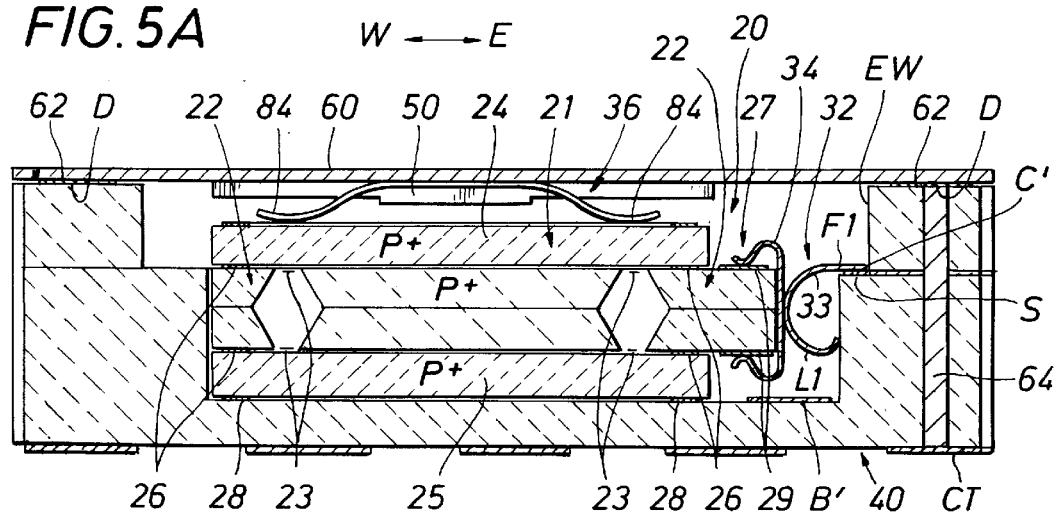
FIGS. 5A, 5B and 5C are transverse cross section views along lines 5A—5A, 5B—5B, and 5C—5C of FIG. 4 of the sensor die after insertion in the ceramic case and after installation of a lid and spring, with FIG. 5A illustrating a conductive path between the top cap of the sensor die and a first terminal on the bottom of the case; with FIG. 5B illustrating a conductive path between the proof mass of the sensor die and a second terminal on the bottom of the case; and with FIG. 5C illustrating a conductive path between the bottom cap of the sensor die and a third terminal on the bottom of the case.

All the plated areas described above are in electrical communication with conductive pads CT, CB and CM disposed at the bottom of case 40 by means of electrical paths or channels called "vias", molded in the ceramic case 40. FIG. 5A shows that a via 64 runs from the plated top ring D to a contact pad at the east end of the bottom of case 40 labeled CT. Refer also to pad CT of FIG. 7. The via 64 is filled with a conductive material, preferably tungsten, and provides a conductive path from the top ring to the bottom contact pad CT. As will be explained below, lid 60 and spring 36 provide a conductive path between a top cap of sensor die 20 (when placed in the cavity) and the gold plated top ring D.

Figure 5B:
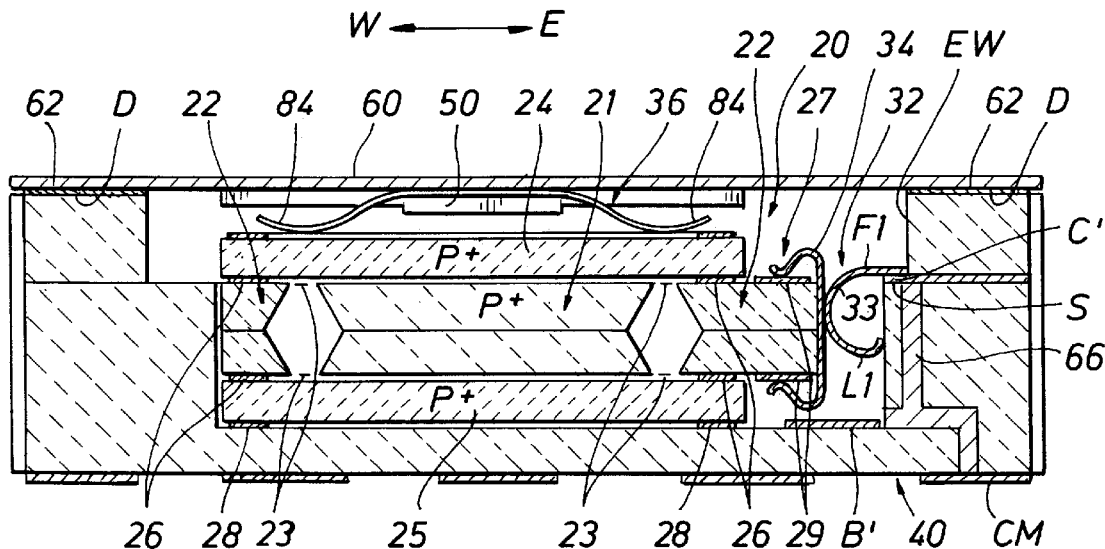

As best seen in FIG. 5B, a second via or channel 66 runs from gold plated remaining portion C' of ledge C at the east end of the cavity to the middle contact pad CM. The via 66 is likewise filled with conductive material, preferably tungsten, and it is gold plated on the surfaces (same with all vias), and provides, as explained below, electrical communication between the center mass 21 of the sensor die 20 and the external pad CM by way of spring 32. Via 66 also is in electrical communication with area B' on the bottom cavity.

Figure 5C:
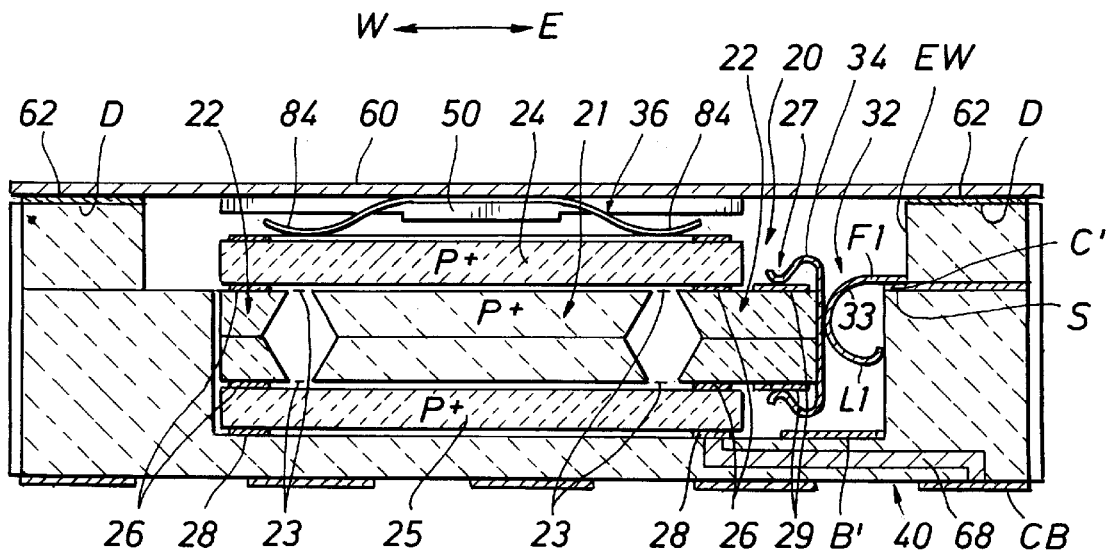

As best seen in FIG. 5C, a third via or channel 68 is provided from the interior gold plated bottom B of the cavity of ceramic case 40 and runs to the external contact CB at the east end of the bottom of the case. The via 68 is also filled with conductive material, preferably tungsten, and provides, as explained below, a conductive path between the bottom cap 25 of the sensor die 20 and the bottom contact pad CB.

The plated gold areas D, C and B, as illustrated in FIGS. 2, 5A, 5B, 5C, and 6 serve an additional purpose of decreasing areas for possible outgassing from any stray molecules in the encased enclosure. As will be disclosed below, the lid 60 which closes the cavity after it is evacuated of air, is also plated with conductive material which inhibits outgassing.

As illustrated in FIG. 1 the ceramic case 40 includes many castellations 80 along its external wall. Such castellations are for mounting of J-leads to the side of the ceramic package and are for facilitating the assembly of case 40 to a Printed Circuit (PC) board using an automatic wave flow soldering device. As explained below, only three J-leads are required for the package, because only three connections to the sensor secured within the package are required (connection to the top cap, center proof mass and the bottom cap). However, for purposes of stability, strong mechanical coupling to a PC board and shock resistance, as many as 24 J-leads are preferred. The J leads are small gold plated metal strips which provide an electrical conductive path to the sensor die 20 when they are ultrasonically welded to the gold bonding contacts, CB, CT, CM (FIG. 7) at the bottom of the ceramic case 40.

Description of Accelerometer Sensor Die 20

Figure 6:
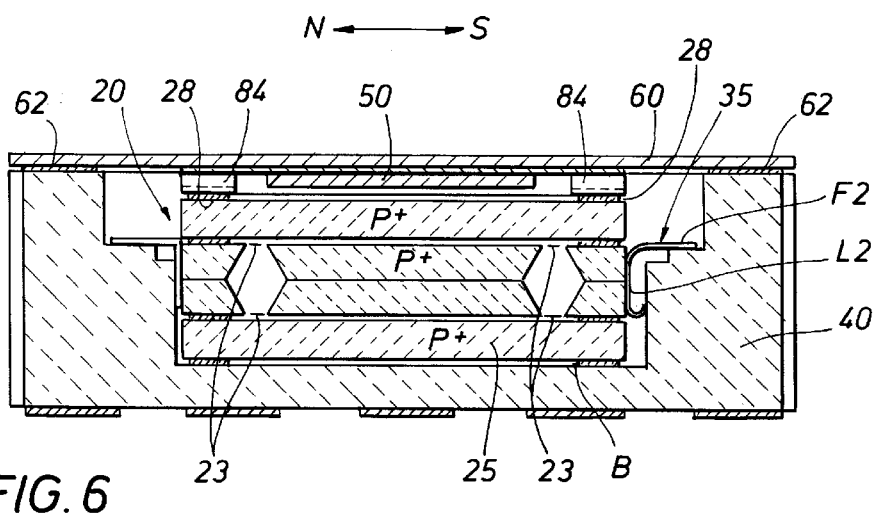
FIG. 6 is a transverse cross section taken along lines 6—6 of FIG. 4 of the sensor die after insertion in the ceramic case and after installation of a lid and spring.
Figure 3:
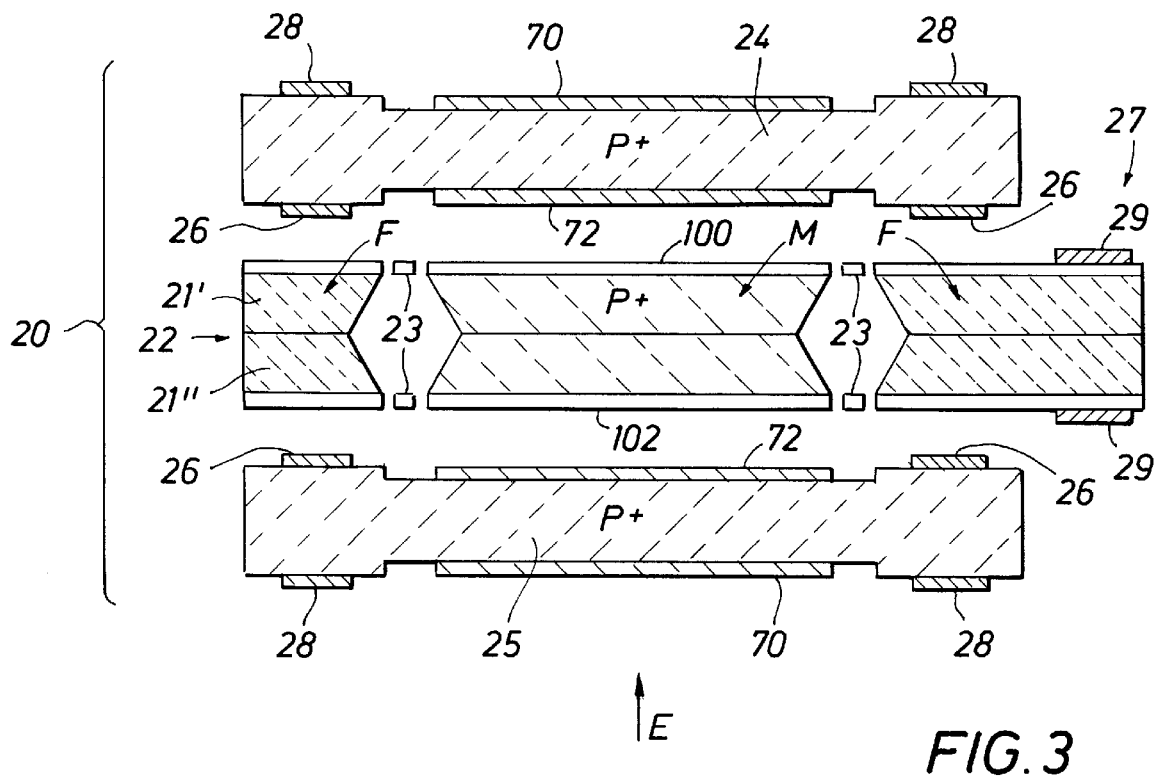
FIG. 3 is an exploded view of the sensor die before it is assembled into the case with illustrations of the center support frame, proof mass, and spring structure and top and bottom caps and with illustrations of gold plating and insulator regions on element surfaces.

As best illustrated in FIGS. 3, 4, 5A, 5B, 5C, and 6 the sensor die 20 is fabricated of micro-machined silicon. FIG. 3 shows that the sensor die 20 includes a middle section 22 of two half sections 21', 21", a top cap 24 and a bottom cap 25. A detailed description of particular aspects of the sensor may be found in U.S. Pat. No. 5,652,384 and U.S. application Ser. No. 08/516,501 which are incorporated by reference herein. The sandwiched elements of FIG. 3, shown in cross section views of FIGS. 5A, 5B, 5C and the orthogonal cross section view of FIG. 6, is about 6.5 mm long by 5.8 mm wide and 2.2 mm high in its preferred construction.

The two sections 21', 21" of middle section 22 define a center proof mass in a surrounding frame member F and eight springs 23 which connect the proof mass into the frame member F. Four of the springs 23 connect the top of the proof mass M to the top of the support frame F; four of the springs 23 connect the bottom of the proof mass M to the bottom of the support frame F. The proof mass M is free to move in the direction of excitation as indicated by arrow E of FIG. 3. The spring-mass-support frame as illustrated in FIGS. 3, 4, 5A, 5B, 5C and 6 provides a stable and planar structure which enhances excitation of proof mass in the direction of excitation E, yet inhibits excitation in directions perpendicular to arrow E.

The two center mass layers 21', 21" are joined together by silicon-to-silicon fusion bonding to form one unitary center member 22.

The top cap 24 and the bottom cap 25 are identical to each other. Each cap 24, 25 has an area of gold plating 72 which faces the top area of proof mass M and the bottom area of the proof mass M. However, the areas 72 of the top and bottom caps 24, 25 are electrically separated from the top and bottom surfaces of proof mass M, because the top cap 24 and bottom cap 25 sandwich the center section 26 with top and bottom insulator 26 serving to separate and insulate the proof mass M from the top and bottom gold plated areas 72. The spacing from the top area 100 of proof mass and the bottom area 102 from the gold plated areas 72 is about one to two micro-meters. The facing areas 72, 100 at the top of the proof mass and the facing areas 102, 72 at the bottom of the proof mass define the reference capacitance between the caps 24, 25 and the proof mass M, when connected to electrical circuitry for measuring acceleration.

Identical gold areas 70 are provided on the top of top cap 24 and the bottom of bottom cap 25 and are placed opposite their corresponding areas 72 which face the areas 100, 102. The strain between the gold area 70 and the P+ silicon of top cap 24 balances the strain between the gold area 72 and the P+ silicon of the top cap 24 created because of the difference in thermal expansion between the gold material and silicon. The same construction for the same purpose is with regard to the bottom gold area 70 and the corresponding mirror image area 72 at the top of the bottom cap 25.

Raised rings 28 of plated gold are provided about the top side of top cap 24 and about the bottom side of bottom cap 25. As shown best in FIG. 6, ring 28 is provided on the top cap 24 for electrical contact with arms 84 of top contact spring 36 for establishing electrical communication with top cap 24. As shown best in FIG. 5C, the raised ring 28 on the bottom of bottom cap 25 is provided for establishing electrical communication with the bottom cap 25 via the gold plated bottom B of the ceramic case 40.

The sensor die 20 is constructed such that the raised rings 28 are about the outer periphery of the top and bottom caps so that when top contact spring (36) is in contact with the raised ring (28), it does not direct any contact force to the center gold area (70) of the top cap (24). This arrangement avoids any deflection of areas 70, 72 of top cap (24). Any such deflection would adversely affect the capacitance between areas 72 and 100 and 102 and 72 and would adversely affect the accuracy of the signal produced which is representative of such capacitance.

In normal operation the proof mass M usually is positioned halfway between the top cap 24 and the bottom cap 25. Movement of the sensor with respect to the supporting frame F changes the position of proof mass M and thereby changes the capacitance between the proof mass and the caps. The movement of the center mass M is proportional to such capacitance and correspondingly to acceleration for certain frequency ranges. The movement of the proof mass M is controlled by picking off an electrical signal from the proof mass M via gold plate regions 29 on the end 27 of center section 22, and then effecting electrostatic rebalance by applying electrical charge signals to the top and bottom caps 24, 25. Such signals are produced by an electrostatic rebalance circuit placed outside the sensor die, but communicating therewith via case contacts CB and CT as described more fully below. U.S. Pat. No. 4,922,756 describes electrostatic rebalance techniques of a Sigma Delta Modulator which are preferred for creating an accelerometer system. Associated electronic circuits are provided on an integrated circuit chip which is placed close to the ceramic package 40.

Description of Center Mass Contact Spray 32

FIGS. 1, 4, 5A, 5B, 5C and 8 illustrate the center mass contact spring 32. As shown in FIGS. 1 and 8, center contact spring 32 is fabricated from one piece spring material which is bent into a middle spring member 33, a side spring member 35, and a side support member 37. The middle spring member 33 is perpendicular to the side spring member 35 and the side support member 37. The top of all three members 33, 35, 37 is flat, with the top flat section F1 of the middle spring member 33 and the top flat section F2 of the side spring member 35 curling down to a loop while the top flat section F3 of the side support member bends down at a right angle.

Figure 4:
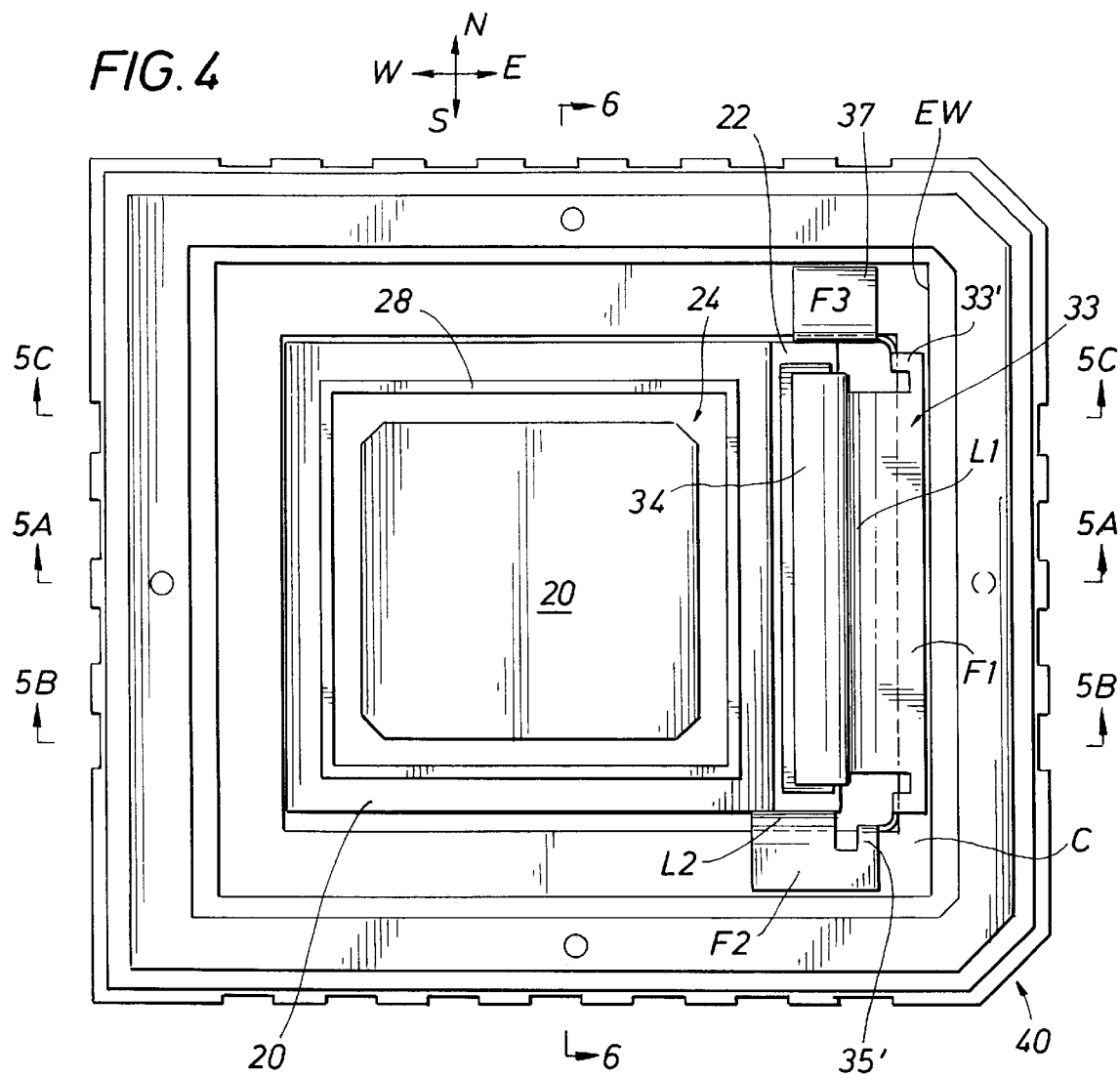
FIG. 4 is a top view of the ceramic case with the sensor die installed therein but before the lid assembly has closed the case.

The center contact spring 32 is inserted into the cavity (as illustrated in FIG. 4) of the ceramic case 40. The three flat sections F1, F2, F3 are supported on the east and north and south (see arrows of FIG. 4) sides of peripheral ledge C, the intermediate peripheral step or ledge inside the cavity of ceramic case 40. As best seen in FIGS. 2 and 5A, 5B, 5C, ledge C at the east end has a further step down S. All of the ledge C is gold plated, except for the east side step down S. An electrical via or channel 66 molded through the ceramic case 40 is filled with conductive tungsten material and provides conductive path from the ledge C' to the bottom contact CM.

After the center contact spring 32 is inserted into the cavity of the ceramic case 40, it is positioned so that center top flat section F1 butts up against the east wall EW as seen in FIGS. 4 and 5A, 5B and 5C. The center contact spring 32 is then anchored within the ceramic case by spot welding the three flat areas F1, F2 and F3 to the ledge C on the north and south and on the ledge C' on the east. Welding is preferred to secure center contact spring 32 within case 40, because welding is clean, efficient, and does not produce outgassing molecules after the cavity is closed and subjected to a vacuum.

As best illustrated in FIGS. 4, 5A, 5B, 5C, and 6 the spring loop L1 of the middle spring member 32 functions to force the sensor die 20 toward the west side of the cavity while the spring member 35 on the south side of the cavity pushes the sensor die 20 to the north side of the cavity (as best seen in FIGS. 4 and 6). The two spring loops L1 and L2 cooperate to force the sensor die 20 to the northwest corner of the cavity of ceramic case 40 and to secure it there against shocks to the case and to position the die 20 correctly between the raised ring 28 of top cap 24 and the top contact spring 36. It is important that the sensor die 20 be secured within ceramic case 40 without the use of any organic materials to effect such securement. The springs acting on the sensor die 20 from two perpendicular directions to force the sensor die into a corner of the cavity of the ceramic case 40 achieves that objective.

The center contact spring 32 also serves as an electrical path between the proof mass M and the outer contact CM as illustrated in FIG. 5B. The flat portion F1 and the loop portion L1 of the middle spring member (see also FIGS. 1 and 8) are gold plated. The ledge portion C' at the east end of the peripheral ledge C is also gold plated. Notice that the step down ledge S provides room for the loop section L1 to curl down from its support at ledge C' while contacting the end of shorting clip 34. A conductive path is created from the external contact pad CM, to the channel or via 66, to the gold plated middle spring member's 33 top flat portion F1 and the loop L1.

Description of Shorting Clip 34

As best seen in FIGS. 1, 4 and 5A, 5B, 5C, a shorting clip 34 is positioned about the east end extension 27 of the support frame 22. The shorting clip 34 is fabricated from 0.003 inch stainless steel or beryllium copper strip. The shorting clip 34, as illustrated in FIGS. 4 and 5 extends about the east end of extension 27 when protrudes eastwardly from top and bottom caps 24, 25 and contacts gold plated sections 29 on the top side and bottom side of the extension 27 of the support frame. As discussed above, the center proof mass M is electrically connected to the projecting end 27 of center section 22 by conductive paths via die springs 23. Accordingly, the shorting clip 34 functions to short the top and bottom halves of proof mass M together. With the shorting clip 34 in place, as illustrated, especially in FIG. 5B, contact to the proof mass M is made from all around the extended portion 27 of the support frame, with the exception of the two adjacent sides.

When the sensor die 21 (which is shorting clip 34 previously installed) is placed into the cavity of ceramic case 40, the center contact spring member 32 contacts the shorting clip 34 on the extended end 27 of the die 20, from the die 20 to the northwest corner of the cavity of the die, and simultaneously establishes a good conductive path from the proof mass M via the shorting clip 34, center contact spring 32, ledge C' and channel 66 to the external contact CM.

Description of Solder Preform 62

Figure 2:
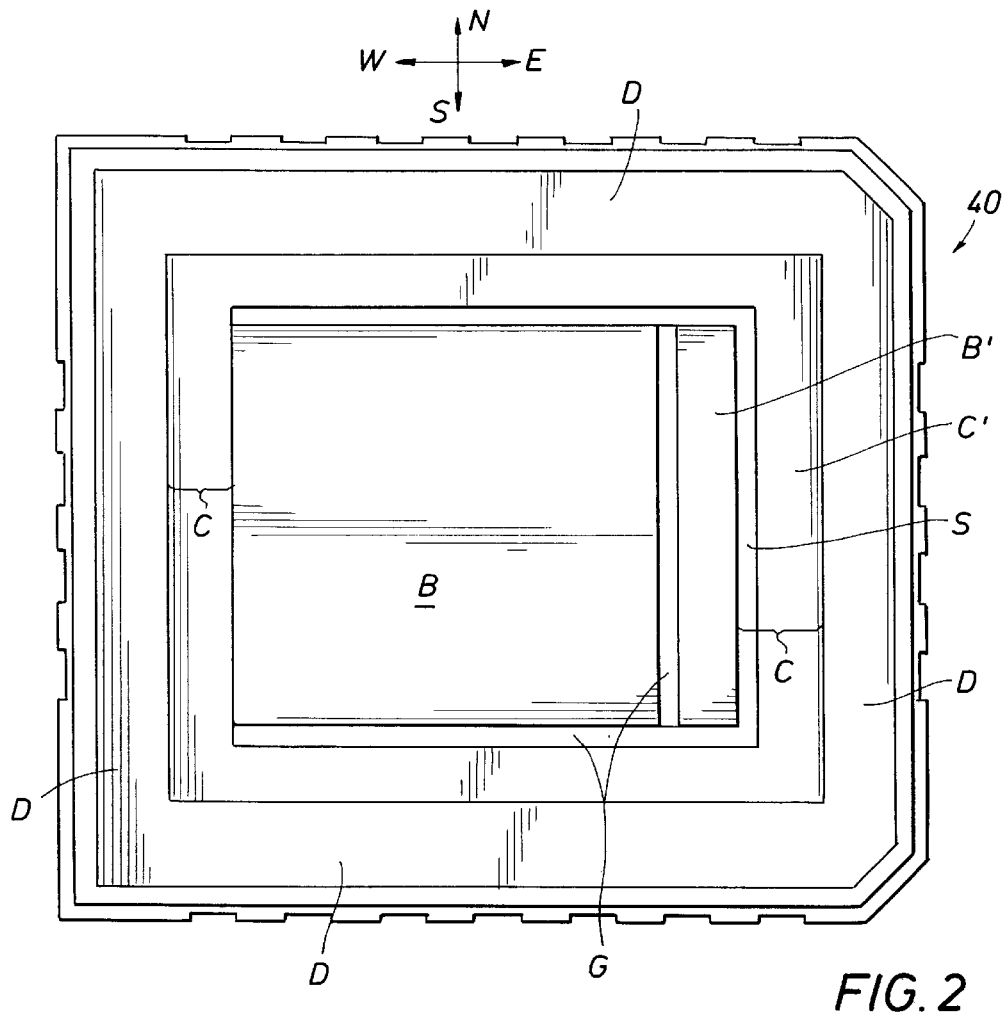
FIG. 2 is a top view of the ceramic case before the sensor die has been installed and shows ledges and gold plating profiles on the interior of the case.

As best seen in FIG. 2 the top ring D is gold plated. As best seen in FIGS. 1, 5A, 5B, and 5C, a solder preform ring 62 is applied to ring D by spot resistance welding. The solder preform ring 62 is a rectangular ring which follows the gold plated ring D of the ceramic top sealing surface. The material of solder preform is preferably an 80/20 gold/tin alloy. Welding the preform ring 62 to the ceramic case 40 is necessary to avoid movement of it when the ceramic case is moved during fabrication steps and during the later step of solder sealing the lid 60 to the top of the ceramic case 40. The solder preform ring 62 cannot be welded to the lid 60, because the lid must be subjected to a getter activation process at a temperature which exceeds the melting power of the solder. ps Description of Lid Assembly As best seen in FIGS. 1, 5A, 5B, 5C and 6 the lid assembly for the die/package/assembly 100 of the invention includes a gold plated metallic lid 60, a gold plated top contact spring 36 and a piece of getter foil 50. The lid is preferably made of Kovar material, and is slightly larger than the top ring D of the ceramic case 40.

The metal top contact spring is made of stainless steel or beryllium copper and is shaped like the letter "H". The center 82 bar of the H spring 36 is spot welding to the bottom of lid 60. The four areas 84 of the top contact H spring curl downwardly from the bottom side of the lid 60.

The H spring 36 is positioned on the lid 60 such that when the lid 60 is joined to ring D of the ceramic case 40 with sensor die 20 installed therein, the arms 84 exactly match the position of the gold plated ring 28 on the top cap 24 of the sensor die 20.

The center contact H spring 36 functions to provide an electrical conductive path from the gold plated ring 28 (see FIGS. 3 and 4) of top cap 24 through the gold plated lid 60 and through the solder preform 62 (which seals the ceramic case 40 to the lid 60) and through the conductive material that fills channel or via 64 (see FIG. 5A) to external contact CT at the bottom of the ceramic case 40.

The getter foil 50 is welded to the bottom surface of the lid 60 and faces the cavity with sensor die 20 in it when the lid 60 is installed. The material of the getter foil 50 is commercially available from SAES and includes chemicals which remove or attract gas molecules that remain in the closed space of the cavity after vacuum processing. The getter foil 50 maintains the degree of vacuum in the closed cavity necessary for operation of the sensor die 60 until it saturates with molecules. A getter foil is conventional for electronic devices required to operate under high vacuum conditions for a long period of time.

The distance between the bottom surface B (see FIG. 2) of the ceramic case and the seal surface (i.e. solder preform 62) at the top of the ceramic case 40 is arranged and designed to be slightly shorter than the sum of the height of the sensor die 20 and the vertical height of the top contact spring 36 before it is compressed. Therefore, when the lid 60 is applied downwardly over the top ring D of the ceramic case 40, the top contact spring 36 is compressed onto gold plated ring 28 of top cap 24 to insure good electrical contact between the top cap 24 and the lid 60. The top contact spring 36 also applies downward force to the entire sensor die such that good electrical contact is made between the conductive ring 28 at the bottom of bottom cap 25 and the gold plated bottom surface B of the ceramic case 40. Such downward force also aids in securing the sensor die within the cavity of ceramic case 40.

When the lid is sealed, there are electrical conductive paths from the top cap 24 to the external contact CT, from the proof mass M to the external contact CM, and from the bottom cap 25 to the external contact CB. Furthermore, the top contact spring 36 and the center contact spring 32 function to maintain the sensor die 20 securely inside the cavity of ceramic case 40 without the sensor die 20 being subject to strain due to thermal variations.

Vacuum Processing

As mentioned above, the sensor die 20 is secured in the cavity of ceramic case 40 with lid 60 closing the interior of the cavity. A high vacuum ($10^{-3}$) mm of Hg for 10 years is necessary for the closed cavity in order to reduce Squeeze Film damping of the proof mass M between the top and bottom caps 24, 25 and to increase the quality of the signal produced by the sensor.

Because of the high vacuum requirement in which the sensor 20 must operate for a long period of time, several pre-assembly cleaning and drying steps must be performed for the sensor die 20 and the ceramic case 40. Prior to actual assembly, the sensor die 20 is plasma and UV ozone cleaned in order to remove any organic matter that might be attached to it during its micro-machined fabrication. The ceramic case 40, the lid 60, and the gold plated top contact spring 36, the center contact spring 32, and the shorting clip 34 are all cleaned with isopropyl-alcohol or a similar cleaning agent and vacuum baked at a high temperature, typically between 300–400° C. to drive off all moisture and trapped gasses in those members. The getter foil 50 and the solder preform 62 are also heated, but not to so high a temperature, because of chemical reactions possible in the getter foil and a possible phase change of the solder due to high temperature. Nevertheless, the getter foil 50 and the solder preform are cleaned and dried. All of the items cleaned as described above are then stored in a dry nitrogen environment after cleaning and drying and prior to assembly.

FIGS. 9A and 9B illustrate apparatus for creating a vacuum inside the closed ceramic case 40 after the sensor die 20 has been installed therein and after the lid 60 has been secured to the top of the ceramic case 40. The apparatus and procedure are provided by Scientific Sealing Technology, Inc. of Downey, Calif. A vacuum chamber 200 is provided by which several die/package assemblies 100 may be processed. Electrical power 220 is provided to a coil 222 about an upper graphite platen 208, for heating it. A nitrogen source and pump 230 is connected to an input port 232 and exit port 234 in order to flush out the interior of vacuum chamber 200 and to back fill it with nitrogen. A temperature sensor T is provided for monitoring the temperature of the upper platen 208. A piston actuator 202 is provided to move vertically a flat lower graphite platen 204.

The first step of the sealing process is to load the ceramic cases 40 into cavities 400 of the lower graphite platen 204. The cases 40 have previously been assembled with the sensor die 20, the center mass spring 32, the shorting clip 34 and the solder preform ring 62 as described previously. The depth of each cavity 400 is slightly shorter than the height of the ceramic case 40, so that a top portion of the case 40 protrudes above the lower platen 204 surface. The lid assemblies, each including lid 60, top contact spring 36 and getter foil 50, are placed in vertically extending rectangular holes of upper graphite platen 208. The top opening of each hole is slightly larger than the bottom opening. Therefore each lid 60 of the lid assembly 212 rests on a tiny step defined by the difference in sizes between the top and bottom openings of the holes of the upper platen 208. The top spring 36 and getter foil 50 face downwardly into the bottom opening. The lid assemblies are each touched by a spring loaded plunger 210 which acts on a center portion of the top surface of each respective lid 60.

The top platen 208 with the lid assemblies 212 is lowered toward lower platen 204 with each lid assembly 212 aligned with a respective ceramic case 40, but separated therefrom by a small distance. The vacuum chamber 200 is then evacuated by operation of vacuum pump 240. The top platen 208 is then heated by operation of power source 220 and coil 222. Heating of top platen 208 causes getter activation of the chemicals on getter foil 50 to start the gas absorption procedure.

After getter activation, the bottom piston actuator 202 is operated to raise the ceramic cases 40 and their sensor die and case assemblies toward their corresponding lid 60 assemblies until contact of the lid 60 with the solder preform ring 62 occurs and the top contact spring 36 contacts the gold plated ring 28 of the top cap 24 of the sensor die 20. The heat of the upper platen 208 is transferred to the lower platen 204. After a short time, the temperature of the lower platen 204 and the ceramic cases 40 is raised high enough for the solder preform ring 62 to melt and flow. The plates 204, 208 are then allowed to cool, and the solder solidifies thereby sealing the lid 60 to the top ring of the ceramic case. The vacuum evacuation and the sealing of the package is then complete.

What is claimed is:

1. A sensor-package arrangement comprising, a case of insulating material, said case having walls which define an internal cavity, said cavity having at least one internal surface with conductive material thereon and having a conductive channel placed in one of said walls between an external conductive contact on the exterior of said case and said conductive material of said internal surface, a sensor die disposed between walls in said cavity of said case, said sensor die having at least one die electrical contact, an electrically conductive spring placed between said conductive material of said internal surface and said die electrical contact, whereby said spring resiliently forces said sensor die against at least one of said walls of said cavity and completes a conductive path which includes said conductive channel from said external conductive contact to said die electrical contact, said case having a conductive top surface and a second conductive channel placed in one of said walls between a second external conductive contact on the exterior of said case and said conductive top surface, said sensor die having top and bottom sides with said bottom side facing downwardly in said cavity and said top side facing upwardly, said top side having a second electrical surface, a conductive lid to which a downwardly facing electrically conductive top spring is attached, said lid being electrically connected while being physically secured to said top surface of said case, said conductive top spring arranged and designed to force said sensor die downwardly in said cavity while contacting said second electrical surface, whereby said lid and said attached secured spring simultaneously close said cavity, force said sensor die into said cavity, and complete an electrically conductive path from said second external conductive contact to said second electrical surface of said die.

2. The sensor-package arrangement of claim 1 wherein, said cavity has a bottom conductive surface, and a third conductive channel placed in said case between said bottom conductive surface and a third conductive contact on the exterior of said case, said sensor die has a third electrical surface which contacts said bottom conductive surface of said cavity when said sensor die is placed in said cavity, and whereby an electrical path between said third electrical path surface of said sensor die and said third conductive contact on the exterior of said case is established when said sensor die is disposed within said cavity and when said lid and said attached spring simultaneously close said cavity.

3. The sensor-package arrangement of claim 1 wherein, said conductive lid is electrically connected and secured to said conductive top surface of said case with solder, and said conductive lid and said forms a seal about said conductive top surface.

4. The sensor-package arrangement of claim 1 wherein, said interior of said cavity when closed by said lid is evacuated to create a vacuum therein, and said sensor die and said springs therein are characterized of being of substantially inorganic materials whereby outgassing of molecules in said vacuum is minimized.

5. The sensor-package arrangement of claim 4 further comprises, getter material disposed in said closed evacuated cavity for absorbing outgassing molecules within said cavity.

6. A sensor-package combination comprising, a case (40) of insulating material having a cavity defined by a first pair of internal walls and a second pair of internal walls which are transverse to said walls of said first pair of internal walls, said cavity being arranged and designed to accept a sensor die therein, said case (40) having an electrical external contact (CM), an electrical internal contact (C') and a conductive path (66) from said external contact (CM) to said internal contact (C'), a sensor die (22) placed within said cavity, said die (22) having a die electrical contact (29, 34), said die having a first pair of sides and a second pair of sides which are transverse to said first pair of sides, a first spring (32, 33) which is electrically conductive and has first and second ends disposed in said cavity between said internal contact (C') of said cavity and said sensor die (22) with said first spring (32, 33) having said first end being fixedly secured to said internal contact (C') and establishing electrical contact at said second end with said die electrical contact (29, 34) solely by the force of said first spring (32, 33) pressing against said die electrical contact (29, 34) at one side of said first pair of sides of said die whereby said first spring (32) secures said die against one wall of said pair of walls of said first pair of internal walls in said cavity and simultaneously completes an electrical path from said die electrical contact to said electrical external contact, and a second spring (35) disposed in said cavity between a side of said second pair of sides of said sensor die (22) and a first wall of said second pair of internal walls of said cavity of said case (40), whereby said second spring (35) secures said die against a second wall of said second pair of internal walls, whereby said first (32, 33) and second (35) springs securely position said sensor die (22) into a corner of said cavity formed by said one wall of said first pair of internal walls and said second wall of said second pair of internal walls.

7. The sensor-package arrangement of claim 6 wherein said first end of said spring is spot-welded to said internal contact (C') of said case 40.

8. The sensor-package arrangement of claim 6 wherein said die electrical contact includes first and second conductive surfaces (29) of a sensor (20) and a shorting clip (34) which electrically contacts said first and second conductive surfaces (29).

* * * * *